United States Patent
Ma et al.

(10) Patent No.: US 6,949,423 B1
(45) Date of Patent: Sep. 27, 2005

(54) MOSFET-FUSED NONVOLATILE READ-ONLY MEMORY CELL (MOFROM)

(75) Inventors: Pingxi Ma, Irvine, CA (US); Daniel Fu, Saratoga, CA (US)

(73) Assignee: Oakvale Technology, Saratoga, CA (US)

( * ) Notice: Subject to any disclaimer, the term of this patent is extended or adjusted under 35 U.S.C. 154(b) by 0 days.

(21) Appl. No.: 10/723,004

(22) Filed: Nov. 26, 2003

(51) Int. Cl.[7] .............................................. H01L 23/58
(52) U.S. Cl. ................. 438/201; 438/130; 438/211; 438/257; 438/470; 257/48; 257/390; 257/391; 257/497; 257/498
(58) Field of Search ................ 438/201, 130, 438/211, 257, 470; 257/48, 390, 391, 497, 257/498

(56) References Cited

U.S. PATENT DOCUMENTS

| | | | |
|---|---|---|---|
| 5,471,422 A | * | 11/1995 | Chang et al. .......... 365/185.26 |
| 5,751,635 A | * | 5/1998 | Wong et al. ........... 365/185.19 |
| 6,229,733 B1 | | 5/2001 | Male |
| 6,404,675 B2 | * | 6/2002 | Banks ................... 365/185.03 |
| 6,680,227 B2 | * | 1/2004 | Kuo et al. ................. 438/215 |
| 6,788,584 B2 | * | 9/2004 | Tedrow et al. ......... 365/189.04 |

* cited by examiner

*Primary Examiner*—Nathan J. Flynn
*Assistant Examiner*—Remmon R. Fordé
(74) *Attorney, Agent, or Firm*—Townsend and Townsend and Crew LLP

(57) ABSTRACT

With directly biasing drain to source in a floating-gate N-MOSFET, a new MOSFET-fused nonvolatile ROM cell (MOFROM) is provided by tunneling-induced punch through of the drain junction to the source. The MOFROM is completely compatible with the mainstream standard CMOS process. The standard MOSFET presents an "OFF" state before the burning and an "ON" state with a stable low-resistance path after the burning.

8 Claims, 9 Drawing Sheets

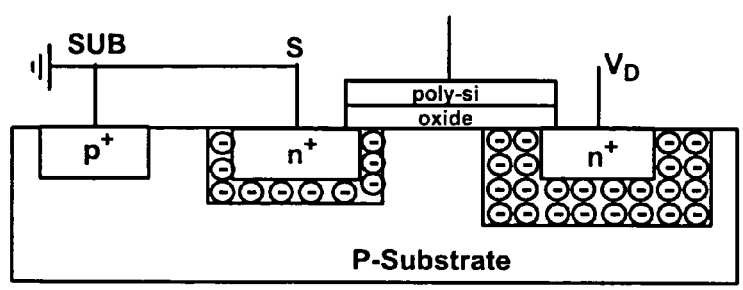
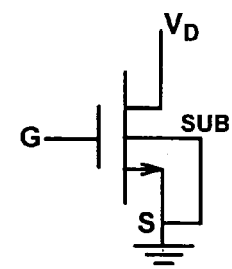
FIGURE 1(b)          FIGURE 1(c)
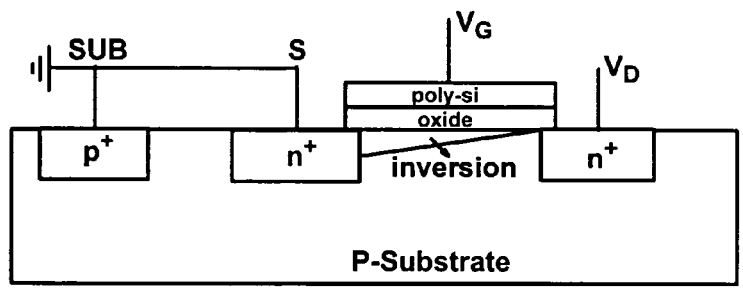
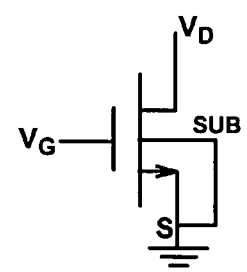
(a)                    (b)
FIGURE 2(a)          FIGURE 2(b)

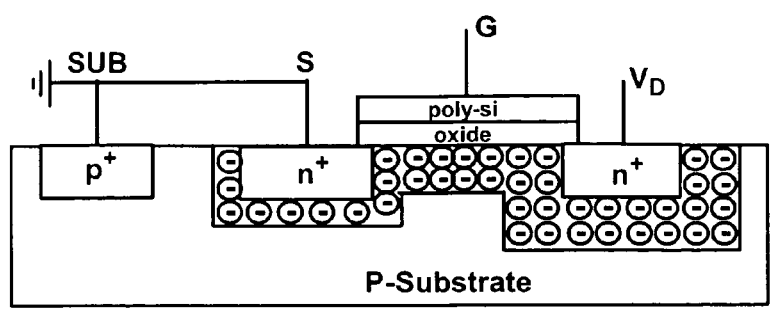 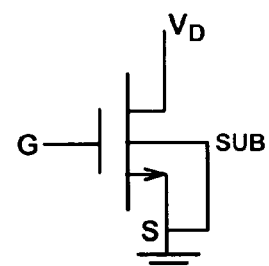
FIGURE 4(a)         FIGURE 4(b)
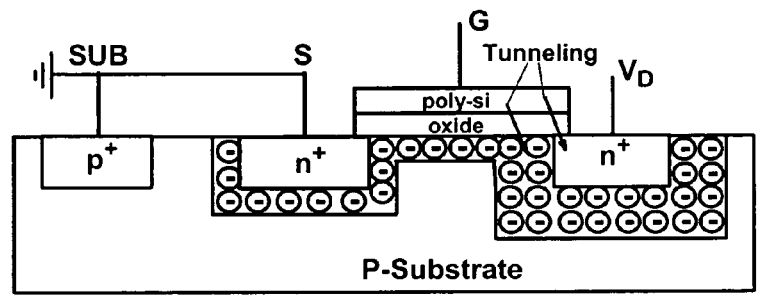
FIGURE 4(c)

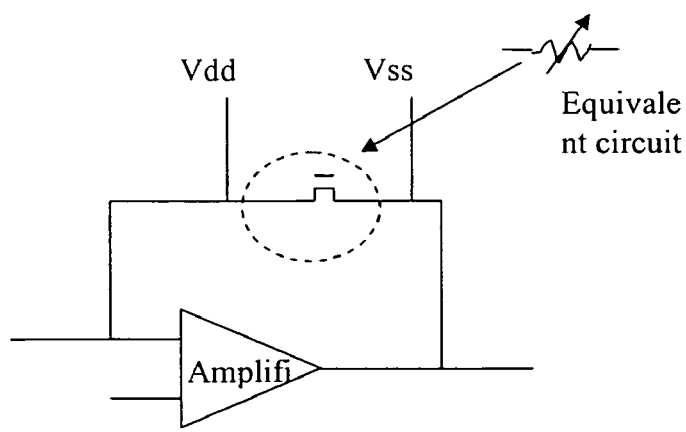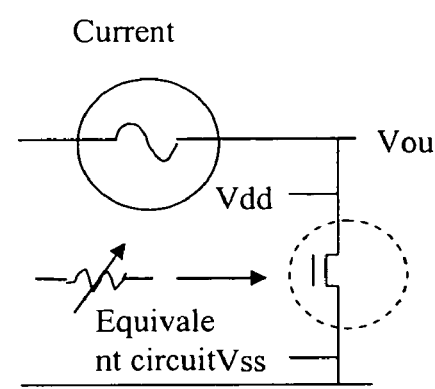
FIGURE 7(a)          FIGURE 7(b)

MOSFET-FUSED NONVOLATILE READ-ONLY MEMORY CELL (MOFROM)

BACKGROUND OF THE INVENTION

The present invention relates to the field of semiconductor devices and integrated circuits, and more specifically to techniques and devices for a read-only memory cell.

The age of information and electronic commerce has been made possible by the development of semiconductor technology and integrated circuits. Integrated circuits are sometimes referred to as "chips." Integrated circuits have been widely adopted and are used in many products in the areas of computers and other programmed machines, consumer electronics, telecommunications and networking equipment, wired and wireless telephony, electronic storage and recording devices, industrial automation, and medical instruments, just to name a few. Integrated circuits are the foundation of the internet and other on-line technologies including the World Wide Web (WWW).

There is a continuing demand for electronic products that are easier to use, more accessible to greater numbers of users, provide more features, and generally address the needs of consumers and customers. Integrated circuit technology continues to advance rapidly. With new advances in technology, more of these needs are addressed. Furthermore, new advances may also bring about fundamental changes in technology that profoundly impact and greatly enhance the products of the future.

The building blocks of an integrated circuit are electrical and electronic elements. These elements include transistors, diodes, resistors, and capacitors. There may be many numbers of these elements on a single integrated circuit. Improvements in the electrical elements and the development of new types of electrical elements will enhance the performance, functionality, and size of the integrated circuit. As an example, a basic electrical property used in an integrated circuit is resistance (also known as "impedance"). In fact, the operation of every integrated circuit is affected to some extent by on-chip electrical resistance. Resistors and other resistive elements are used in the implementation of many circuits on an integrated circuit.

An application of a semiconductor device having a variable impedance may be used to implement a memory cell. A memory cell is the building block of memory integrated circuits and storage systems such as read-only memories, random access memories, content addressable memories, and many others. Memories are a building block for computers and other programmed machines.

As can be appreciated, there is a need to provide techniques and devices for implementing variable impedances and memory cells for integrated circuits.

SUMMARY OF THE INVENTION

The invention is a new nonvolatile ROM cell called a MOSFET-fused nonvolatile ROM cell (MOFROM). The MOFROM cell has an OFF state, an unprogrammed state, and an ON state, a programmed state. When in the unprogrammed state, the cell has a relatively high impedance compared to when the cell is in the programmed state. In a specific implementation, the unprogrammed state impedance is about five times or greater than in the programmed state. For example, the impedance for a specific MOFROM embodiment in the programmed state is about 660 ohms, but this impedance value will vary depending on the size of the device.

The MOFROM cell may be fabricated using a standard CMOS process in a similar manner as n-type or p-type MOSFET transistor devices are. The MOFROM cell is configured using a new phenomenon the inventors call tunneling induced punch through (TIPT). To use tunneling induced punch through, a MOFROM is directly biased with a voltage between the drain and source and the gate floating; this will punch through the drain junction to the source. This voltage may be above a breakdown voltage of the transistor. The MOFROM is completely compatible with the mainstream standard CMOS process. The standard MOSFET presents an "OFF" state before the burning and an "ON" state with a stable low-resistance path after the burning.

With the gate floating, we have measured an N-MOSFET's I-V curve and observed a new physical phenomenon, tunneling induced punch through (TIPT). This effect induces the punch-through between the drain and source junctions at a lower drain bias voltage. The new nonvolatile ROM cell is invented by utilizing the TIPT effect. An N-MOSFET of 0.13 micron gate-length can be burned at about 3.7 volts while a 0.11 micron gate-length can be burned at a lower voltage of about 3.2 volts. With CMOS process technology continually scaling-down, we expect to achieve a decreasingly lower burning voltage, voltage needed to take advantage of TIPT. Even though the invention is not limited to a gate-floating configuration for an N-MOSFET, we consider this case to be the most efficient for three typical applications of the invention: circuit precision tuning, programmable read only memory (PROM), and programmable switch (PS).

In an embodiment, the invention is a method of operating a transistor device including floating a gate electrode of the transistor device and applying a voltage between a drain and a source electrode of the transistor device to cause a burned region in a channel region of the transistor device, even after the voltage is removed. The burned region provides a low impedance path between the drain and source electrodes. The burned region extends from the drain to the source and has a deeper depth closer to the drain than the source electrode. An impedance between drain and source electrodes for the transistor device may be about five times or greater than that for transistor device with the burned region.

In an embodiment, a semiconductor device including a source region formed in a substrate, a drain region formed in the substrate, a polysilicon gate formed on the substrate and positioned between the drain and source regions, and a burned region, formed after a burning operation, formed beneath the polysilicon in the substrate between the drain and source, where the burned region provides a low-impedance path between the drain and source, even when the polysilicon gate is floating. Although polysilicon is the gate material in this embodiment, other types of material (such as metal or nitride) may be used to implement or form the gate of the transistor.

Furthermore, an impedance for the semiconductor device from drain to source may be about five times or greater than that for the semiconductor device without the burned region. The low-impedance path may provide an impedance of about 660 ohms or less. A channel length of the semiconductor device is the same as a length of the burned region, and a depth of the burned region is deeper closer to the drain than closer to the source. The burned region should comprise more defects and dislocations than before forming the burned region.

In an embodiment, the invention is an electronic system having semiconductor devices including one or more MOFROMs of the invention. In a more specific embodiment, the invention is a read-only memory integrated circuit comprising memory cells formed using one or more MOFROMs of the invention. According to another aspect, the invention is a method of operating an electronic system including programming one or more transistor devices using tunneling induced punch through.

In an embodiment, the invention is an integrated circuit including a number of row lines and column lines arranged in rows and columns. The integrated circuit includes an array of memory cells, each memory cell having a drain electrode connected to one of the number of column lines and a source electrode connected to one of the number of row lines, where a memory cell has a first state where the memory cell has a burned region in its channel to provide a lower impedance path than when the memory cell is in a second state. The invention includes a decoder circuit, connected to the number of row lines, to select a row in the array of memory cells.

In an embodiment, the invention is integrated circuit including a first interconnect line, a second interconnect line, and a programmable switch having a transistor connected between the first and second interconnect lines, where the programmable switch has a first state and a second state, and in the second state, the transistor has a burned region in its channel region, providing a lower impedance path between the first interconnect line and the second interconnect line in the second state than in the first state.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIG. 1(b) shows a cross section of an NMOS transistor.

FIG. 1(c) shows a schematic symbol of an NMOS transistor.

FIG. 2(a) show a cross section of an NMOS transistor biased by $V_G$, greater than $V_T$.

FIG. 2(b) shows a schematic symbol of the device in FIG. 2(a).

FIG. 4(a) shows when biasing the drain with $V_D$ and floating the gate terminal there will be a punch-through breakdown as $V_D$ is gradually increased to $V_{PB}$ of a punch-through breakdown voltage.

FIG. 4(b) shows a schematic symbol of the device in FIG. 4(a)

FIG. 4(c) shows a tunneling current through the gate oxide of a device.

FIG. 7(a) shows a first application of a MOFROM, used as a variable impedance for a operational amplifier circuit.

FIG. 7(b) shows a second application of a MOFROM, used as a variable impedance.

DETAILED DESCRIPTION OF THE INVENTION

Figure 1A:
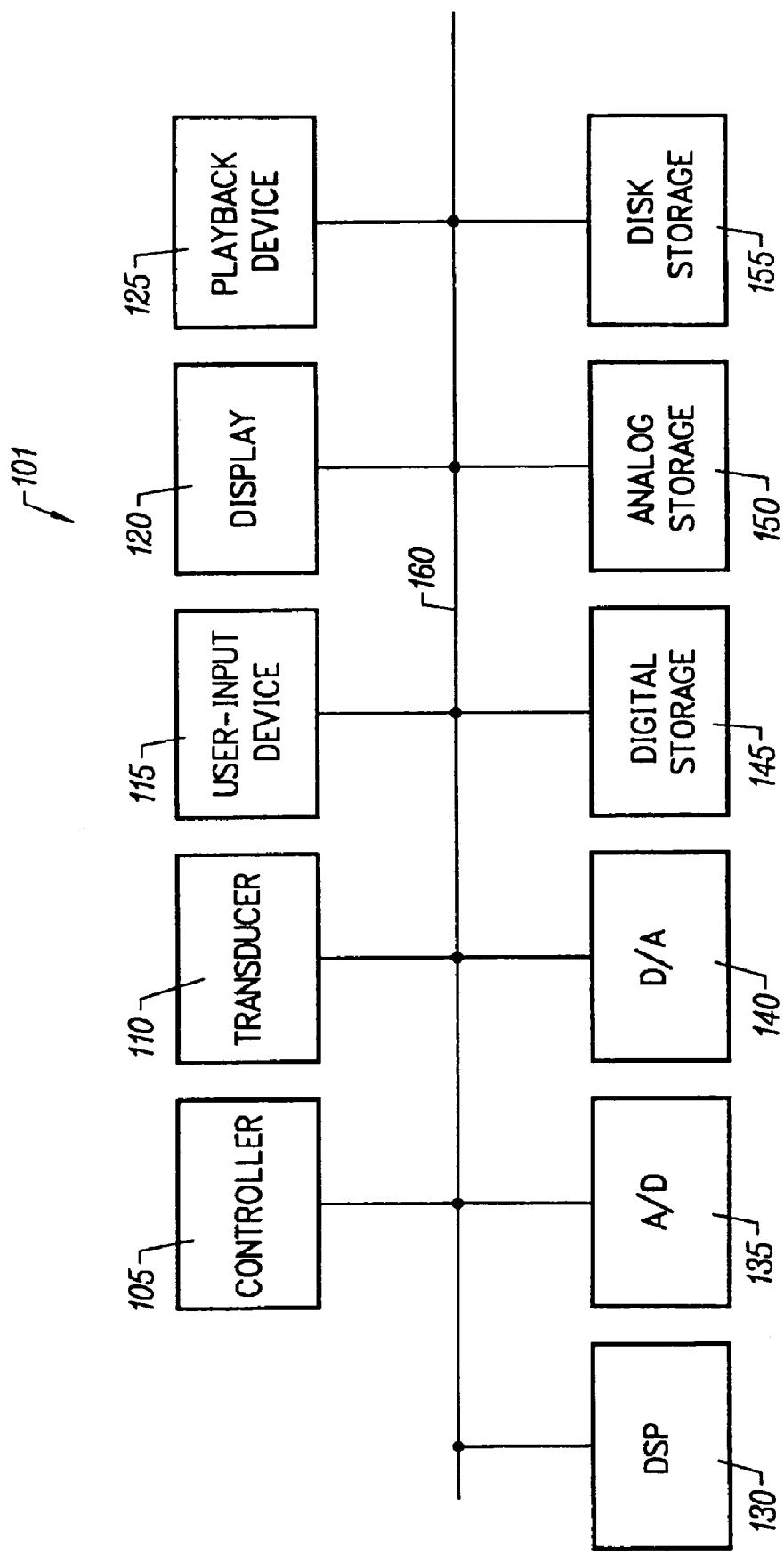
FIG. 1(a) shows an electronic system.

The present invention may be used in the implementation of electronic devices and systems such as shown in FIG. 1(a). FIG. 1(a) shows an electronic system 101 with a controller 105, transducer 110, user-input device 115, display 120, playback device 125, digital signal processor (DSP) 130, analog-to-digital converter 135, digital-to-analog converter 140, digital storage 145, analog storage 150, and disk storage 155. These components may all be present in the same electronic system. Alternatively, an electronic system may contain any combination of the components shown. For example, an electronic system such as a computer may include a controller (e.g., microprocessor, computer motherboard), display, disk storage, display, and user-input device. The components of the electronic system are coupled together using interconnection facility 160. Examples of an interconnection facility include a wire, system bus, network, the internet, and others.

Complementary metal-oxide semiconductor (CMOS) process is a mainstream technology for digital system fabrication. The core device such as N-MOSFET can be used as a simple switch to represent "1" by OFF or ON and "0" by ON or OFF.

FIGS. 1(b) and 1(c) show a typical long-channel N-MOSFET cross-section and its representative symbol with the drain terminal biased by $V_D$ and the gate-floating. The drain PN junction is reversely biased while the source junction is forward biased. The drain junction therefore exhibits a wider space-charge region than the source junction. The reversely-biased drain PN junction can only have a leakage current rather than a conductive current following through the channel between drain and source. The N-MOSFET keeps an OFF before breakdown.

As FIG. 2 shows, when the gate is biased by $V_G$ less than $V_T$ of the threshold voltage, the channel is in depletion and the N-MOSFET keeps OFF as the gate-floating does. When the gate is biased more than $V_T$, the channel is in inversion. The inversion layer bridges between the drain and source, allowing a conductive current following through the channel, keeping the N-MOSFET ON. This is the principle for the MOSFET to be used as a switch in digital system design.

Figures 3A, 3B:
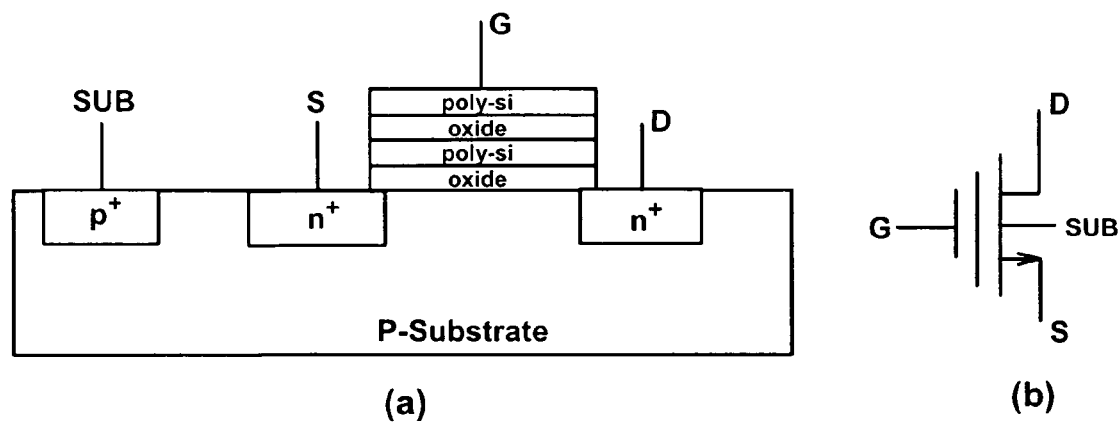
FIG. 3(a) shows a cross section of an electrically erasable memory cell.
FIG. 3(b) shows a schematic symbol of an electrically erasable memory cell.

Nonvolatile ROMs are of significance in electronic system design. The majority of existing nonvolatile memory cells such as erasable-programmable ROM (EPROM), electrically-erasable programmable ROM (EEPROM) and flash electrically-erasable programmable ROM (Flash EEPROM) are based on an extra floating-gate MOSFET process. This configuration typically has an extra gate inserted between the control gate and MOSFET's channel as FIG. 3 shows. This generally doubles the gate-oxide thickness, resulting in a reduced device transconductance as well as an increased threshold voltage. Another more severe disadvantage of the extra floating-gate structure is an incompatibility with the mainstream standard CMOS process presented above.

A. Tunneling Induced Punch Through (TIPT)

This phenomenon is experimentally observed for the first time in this invention. We invent the new ROM cell just based on the TIPT effect. With the CMOS process scaling-down, there are two effects needed particularly addressed. One is the gate length shrink causing a low-voltage punch-through between the drain and source junctions. As FIGS.

4(a) and 4(b) show, when biasing the drain with $V_D$ and floating the gate terminal, we can observe a punch-through breakdown as $V_D$ is gradually increased to $V_{PB}$, which is a punch-through breakdown voltage. The punch-through occurs when the drain junction space-charge region runs into the source junction space-charge region, allowing a rapidly-risen current rather than the leakage current following through the channel. Another effect is the gate-oxide thickness shrink increasingly causing a tunneling current through the gate-oxide. As FIG. 4(c) shows, with a same bias configuration as the FIG. 4(b), we can consider a current tunneling through the gate-oxide from the polysilicon gate to the drain/channel when gradually increasing the drain bias voltage of $V_D$. This tunneling current generates a positive potential at the polysilicon gate, causing the channel to deplete (in a depletion mode), eventually pushing the punch-through at a lower bias voltage of $V_D$. This punch-through occurs at the lower bias voltage actually due to the tunneling current early induced and we therefore call it "tunneling induced punch through" (TIPT).

B. New ROM Cell

Figure 5A:
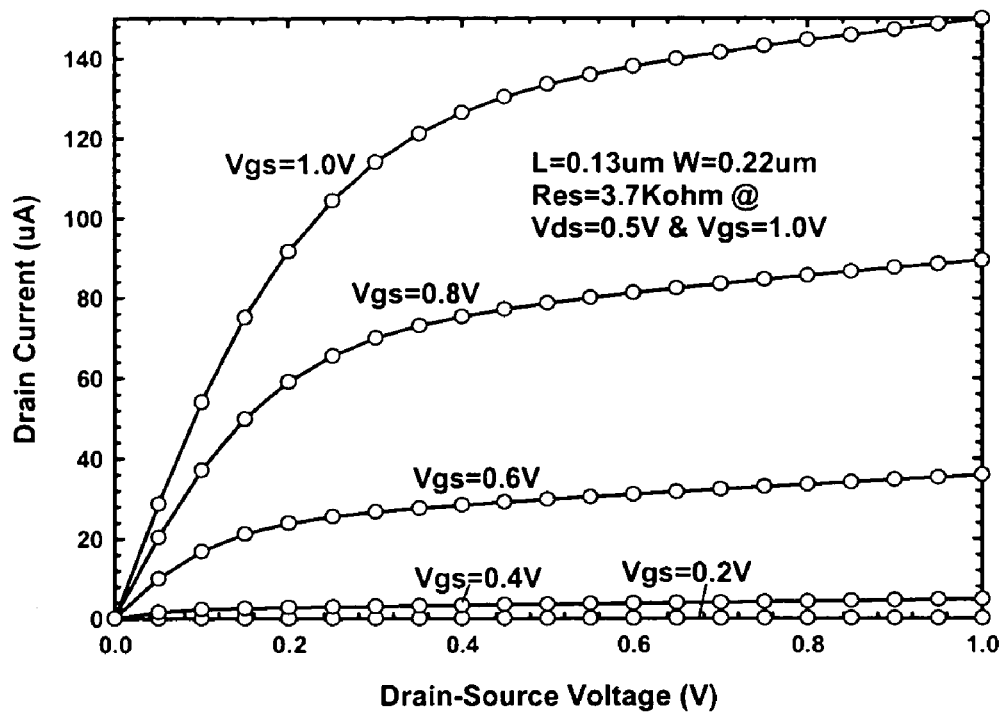
FIG. 5(a) shows I-V and programming characteristics for a MOFROM programmable switch.
Figure 5B:
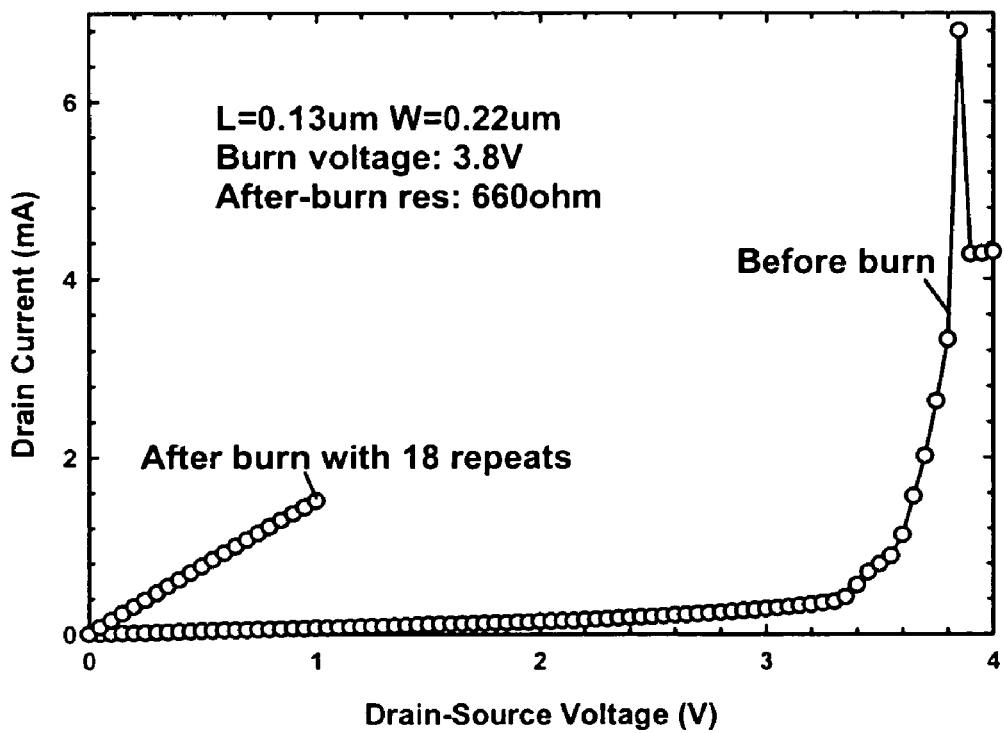
FIG. 5(b) shows I-V and programming characteristics for a MOFROM programmable switch before and after burning.

We have utilized the TIPT to develop a new nonvolatile ROM cell. A specific implementation of this cell is referred to as a MOFROM cell. When biasing N-MOSFET with $V_{DS}$ at the drain terminal and keeping the gate-floating, we have experimentally observed an I-V curve of the 0.13-micron by 0.22-micron device as FIGS. 5(a) and 5(b) shows. The N-MOSFET is induced to breakdown at 3.4 volts by the tunneling current and then burned at 3.8 volts into a low-resistance path through the channel. We have repeated the measurement for 18 times after the burning and observed a stable resistance there. This verifies that we can achieve an OFF state before the burning and an ON state after the burning. This implementation is the new invention of the nonvolatile ROM cell. With the invention processing, we can prominently feature its advantage as a complete compatibility with the main-stream standard CMOS technology.

A specific size device with a gate length of the device is 0.13 microns and the gate width of the device is 0.22 microns is discussed as an example. However, the invention would be applicable to devices of other sizes. The device size (width or length of the device, or both) would depend on the specific application. The invention is however not limited to a MOFROM cell with the dimensions discuss above. A MOFROM cell may be fabricated using any length and width dimensions desired to achieve the desired electrical characteristics. For example, the MOFROM cell may have a length of 0.13 microns or less. The length may be 0.12 microns, 0.10 microns, 0.08 microns, 0.06 microns, 0.04 microns, 0.02 microns, or less than 0.01 microns. The MOFROM cell may have a width of 0.22 microns or less. The width may be 0.18 microns, 0.16 microns, 0.14 microns, 0.12 microns, 0.10 microns, 0.08 microns, or 0.06 microns or less. Generally, it is desirable to design a cell to use less area because this allows the manufacture of greater numbers of cells in a single integrated circuit. However, a larger device with a great W to L ratio should have a lower resistance after burning. A MOFROM cell may have a width greater than 0.22 microns. For example, the width may be 0.35 microns, 0.6 microns, 0.75 microns, 1 micron, 1.2 microns, 1.5 microns, or other widths. A MOFROM cell may have a length greater than 0.13 microns. For example, the length may be 0.15 microns, 0.18 microns, 0.20 microns, 0.24 microns, 0.35 microns, 0.40 microns, 0.5 microns, 0.7 microns, or 1 micron or more. The MOFROM cell may have a channel length in a range from 0.35 microns to 0.65 microns.

Furthermore, FIG. 5(a) shows a resistance of about 3.7K ohms at VDS of 0.5 volts and VGS of 1 volt. The resistance may be greater then 3.7K ohms, such as 5K ohms, 10K ohms, 20K ohms, 40K ohms, 80K ohms, 100K ohms, 300K ohms, 700K ohms, 1 M ohms, 1.25 M ohms, 2 M ohms, 3 M ohms, or greater. However, the resistance may be less than 3.7K ohms, such as 1K ohm or less. It is generally desirable to have a relatively large difference in the resistance of the device before and after burning (discussed below) because this would give greater margins for distinguishing between a programmed or unprogrammed cells.

FIG. 5(b) shows after using a burn voltage of 3.8 volts, the after-burning resistance will be about 660 ohms. However, depending on factors such as the specific geometry and characteristics of the process technology the specific value of the resistance after burning will vary. In the specific example, the specific resistance is about 660 ohms. For a device with greater width, the resistance would be less because the W/L ratio is greater. Similarly, for the device with greater length, the resistance would go up because the W/L ratio is reduced. Depending on the factors such as the size or dimensions and the process technology, the after burning resistance may be greater than 660 ohms, such as 720 ohms, 800 ohms, 860 ohms, 1K ohm, 1.5K ohms, or even greater. In other embodiments, the after burning resistance may be less than 660 ohms, such as 600 ohms, 540 ohms, 480 ohms, 420 ohms, 360 ohms, 300 ohms, 275 ohms, 225 ohms, 125 ohms, or less than 100 ohms.

Figure 6A:
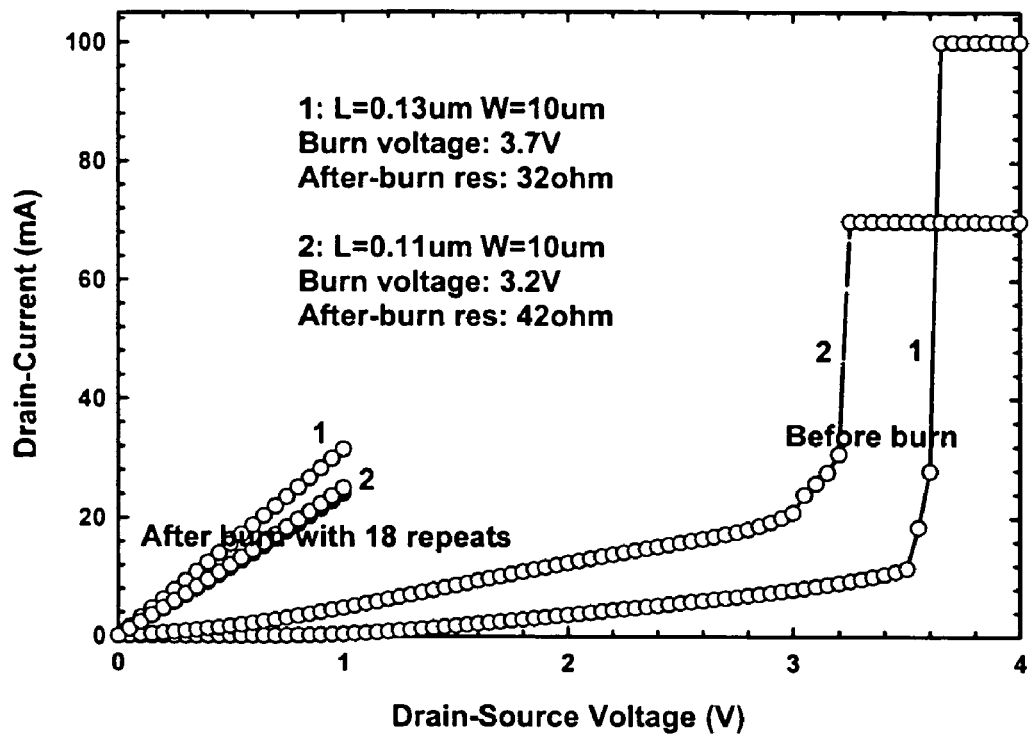
FIG. 6(a) shows a programming characteristic of a MOFROM.

As FIG. 6(a) shows, biasing a gate-wider N-MOSFET and keeping the gate-floating, we have experimentally compared the shorter gate-length (0.11 micron) burning with the longer gate-length (0.13 micron) and found the shorter one has a lower burning voltage (about 3.2 volts) than the longer one (about 3.7 volts). This verifies that we would achieve a decreasingly lower burning voltage as the CMOS process continuously scaling-down.

Figure 6B:
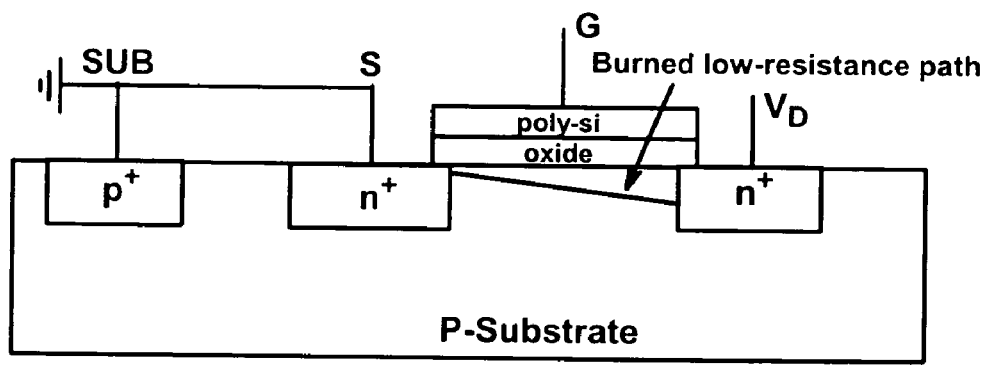
FIG. 6(b) shows a cross section of a MOFROM cell after burning, showing a burned low-resistance path.

FIG. 6(b) shows a cross-section of a MOFROM cell showing the burned low-resistance path, after burning. As the figure shows, the path is deeper or thicker closer to the drain region and gradually becomes less deep or thinner as the path gets closer to the source region. FIG. 6(b) shows a burning path that decreases linearly with position in the path from drain to source. Depending on the burning conditions, the burning path may have other shapes, such as a geometric or exponential decrease. Furthermore, FIG. 6(b) is merely an example of the burned region. The burned region may not be a straight line or a curve. Generally the burn region does not extend below the junction depth of the drain or source regions because even shallow depth could also provide enough low resistance for applications.

A length of the burned region will depend on how large the burning current is. Typically the length will be extend the entire length or be about the same as the channel length. But sometimes, the length of the burned region may be less than the channel length.

FIG. 6(b) shows there will be a variation in burned region depth depending on a position in the channel. This is because the burning occurs once the drain junction punches through the source junction. There is a rapidly increasing current which will pass through the channel. Since the drain junction is reverse-biased compared with the source junction forward-bias, the region near the drain should have a larger resistance and generate much more thermal energy there to start burning the channel. This is why the drain channel is deeper than the source. The burned channel depth should depend on the burning time and applied voltage. Generally the long burning time and higher burning voltage should cause a deeper burned region. The burning depth is deeper closer to the drain and shallower closer to the source as shown in FIG. 6(b).

After burning, the material in the burned path region is still silicon. However, it will typically contain defects, dislocations, and impurities which cause the low resistance. The burned region has burned the reversely-biased drain junction and presents a low-resistance path, a completely different structure from the reversely-biased drain junction and its wide depletion (before burning). The term "burn" is a macro description. "Burned" means the device has lost its original properties such as a high resistance channel. "Fused" typically means something analogous to melted. In the present case, the term "fused" comparing with "burned" is a micro description. The channel may not be melted but still become low resistance due to impurity moving and defect and dislocation generation. When addressing the macro behavior of the device, "burned" is better description, although there may be some fused areas in the burned area, so "fused" may be suitable as a micro description.

The burned device is dissimilar to a leaky device in the following way. A "leaky" device means that the device degraded and still keeps the partial original properties. In contrast, the "burned"device almost completely loses its original property such as from high resistance to low resistance. Before burning, the device presents a high resistance channel; the channel can be described as a back-to-back diodes and one of them is in reverse biased with a high resistance. Once burned, the drain and source junctions punch through together and the junction burned with the impurity, defect, and dislocation moving.

In operation, a procedure for burning the device with a floating gate structure will be to: (a) apply a voltage between the drain and source over the tunneling induced punch through voltage VPB, and (b) control the burning current to form burning resistance desired. More specifically, a breakdown voltage (e.g., voltage to cause tunneling induced punch through) is applied to the drain electrode of the transistor device. After applying the breakdown voltage, a burning voltage is applied to the drain electrode of the transistor device, wherein the burning voltage is higher than the breakdown voltage. This burning voltage causes the burning current that forms the burning resistance. In other embodiments, there may be variations to these techniques of achieving this burned region.

In the above specific embodiment, we have kept the gate floating in the description. However, this does not mean that the gate can only keep floating in the invention. Actually when biasing the gate less than $V_T$, we could still achieve a similar burning result. When biasing the gate more than $V_T$, we could observe a conductive current through the inversion channel. With a limit burning current in practical applications, the gate-floating or lower-bias case could more easily burn MOSFETs than the higher-bias gate case ($V_D > V_G$). In the gate-floating or lower-bias case, there are almost no electrons in the channel. Therefore, the energy the punch-through current brings could only dissipate into the acceptor/lattice, generating dislocations/defects in the channel, and further burning the junction into a lower resistance path. In the higher-bias gate case, however, the electron in the inversion layer could bring part of energy away, allowing the junction to tolerate a higher burning current. Thus the gate-floating should be the best to use an efficiently minimal-current burning the junction into a low resistance path.

Furthermore, even though we have used an N-MOSFET as a description example, our invention is also applicable for the P-MOSFET.

The MOFROM is applicable for circuit precision tuning. FIGS. 7(a) and 7(b) show two typical tuning applications of operational amplifier (OPAM). FIG. 7(b) shows a current source application where the current source is implemented using an OPAM. The circuit precision can be significantly improved by fine-tuning the resistor value. Both OPAMs gain and bandwidth and the source output-voltage can be fine-tuned with an adjustable resistor, implemented using the device of the invention. The resistor can be realized by conventional techniques, such as either laser trimming resistors on wafer or current burning polysilicon or metal fuses. The former method generally requires high-cost equipment and the latter has cost due to larger wafer area. The MOFROM can realize the resistor without these disadvantages and will be completely compatible with the mainstream CMOS process.

By programming (burning) single or array, or both, of the MOFROM, we can fine-tune the resistor value. As the FIGS. 5 and 6 show, the fine-tuned precision generally can be accurately determined by configuring the array or adjusting the length and width of MOFROMs in design, or both. Thus we can realize the circuit precision tuning by using the MOFROM invention. In an embodiment, a number of MOFROM devices may be connected in parallel and the resistance provided by the parallel devices will be determined by programming one or more of the devices. In another embodiment, a number of MOFROM devices of various dimensions may be connected in parallel and the resistance provided by the parallel devices will be determined by programming different ones of the devices. In yet another embodiment, a number of MOFROM devices are connected in series and parallel, may be in an array structure, and the devices are programmed to give a desired impedance or resistance value.

Figure 8A:
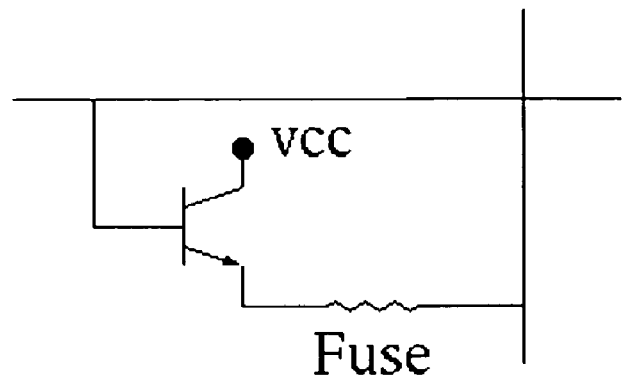
FIG. 8(a) shows an npn and fuse PROM cell.
Figure 8B:
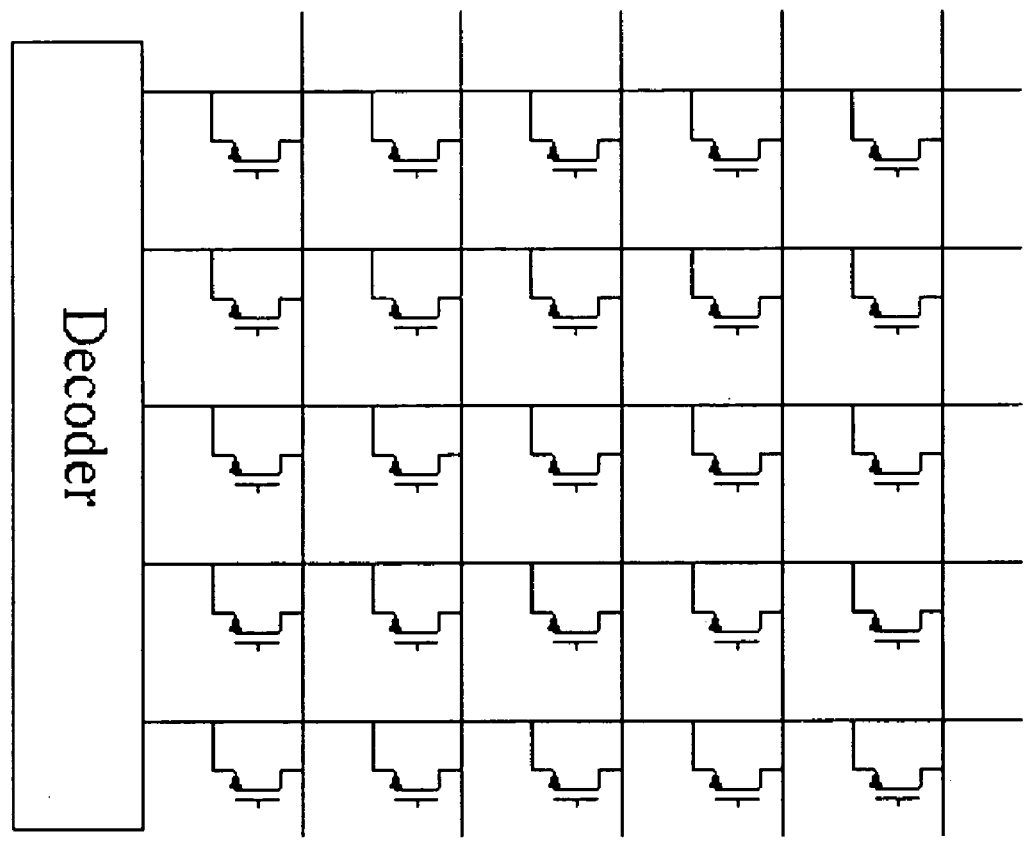
FIG. 8(b) shows a MOFROM-cell PROM array.

Another important application of the MOFROM, as its name implies, is as a programmable read only memory (PROM). FIG. 8(a) shows a conventional PROM cell that can be programmed using a metal or polysilicon fuse fusing. By replacing the npn and fuse with the MOFROM, we can realize a typical PROM array as FIG. 8(b) shown. The PROM array can be programmed by programming (burning) the MOFROM cell. For example, the MOFROM cell varies in impedance from an "OFF" state of more than several mega ohms (as shown in FIG. 5a) to an "ON" state of about 660 ohms (as shown in FIG. 5b).

Compared to a conventional npn and fuse, the MOFROM has lower wafer area cost and is completely compatible with the mainstream CMOS process. In this way, a MOFROM may be used in implementing a PROM and its array-based applications such as device ID and integrated into a multi-functional chip system. For example, a MOFROM PROM may be used in computers (such as a computer BIOS), storage devices (including hard disks, CDs, DVDs, and Flash drives), wireless phones and other telephony devices, personal digital assistants (PDAs), networking equipment, and other electronic products.

Figure 9A:
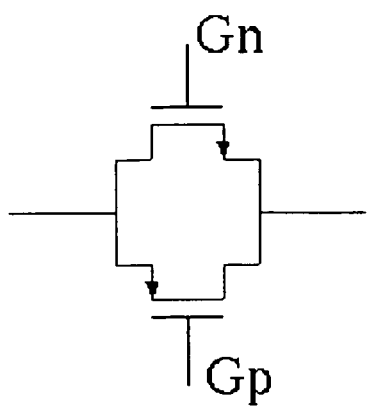
FIG. 9(a) shows a CMOS pass-through gate.
Figure 9B:
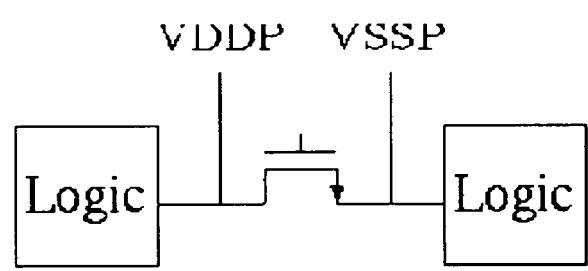
FIG. 9(b) shows a MOFROM pass-through gate.

Another typical application of the MOFROM is programmable switch (PS). FIG. 9(a) shows the conventional CMOS pass-through gate and FIG. 9(b) shows an implementation using a MOFROM's PS gate. The PS can program by applying the burning voltage on $V_{DDP}$ and grounding $V_{SSP}$. With 0.13 micron gate-length, 0.22 micron gate-width and the gate-floating, FIG. 5 shows the typical programming condition, about 3.7 volts burning voltage, several millisecond burning time and 660 ohm after-burning resistance. Comparing with the conventional CMOS pass-through gate, the MOFROM PS presents around a half wafer area reduction due to single nFET used rather than the CMOS with nFET plus pFET. In addition, the CMOS "ON" could be typically with 3.7K ohm conductive resistance while the PS could be with 660 ohm. The reduced resistance could accelerate the gate switch and lower the voltage-drop once conductive current passing it through. The MOFROM PS has the advantage of the conventional CMOS gate and enhances its based applications such as programmable logic devices (PLD), field programmable gate arrays (FPGA), and other logic interconnections on CMOS chips.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. A method of operating a transistor device comprising:
    floating a gate electrode of the transistor device;
    applying a voltage between a drain and a source electrode of the transistor device to cause a burned region in a channel region of the transistor device, even after the voltage is removed.

2. The method of claim 1 wherein the burned region provides a low impedance path between the drain and source electrodes.

3. The method of claim 1 wherein the burned region extends from the drain to the source and has a deeper depth closer to the drain than the source electrode.

4. The method of claim 1 wherein an impedance for the transistor device is about five times or greater than that for transistor device with the burned region.

5. A method of operating an electronic system comprising programming one or more transistor devices according to the method recited in claim 1.

6. The method of claim 1 wherein the transistor device has a width of 0.22 microns or less and a length of 0.13 microns or less.

7. The method of claim 1 wherein the transistor device is at least one of a MOSFET transistor, n-type MOSFET transistor, or p-type MOSFET transistor.

8. The method of claim 1 wherein the applying a voltage comprises:
    applying a breakdown voltage to the drain electrode of the transistor device; and
    after applying the breakdown voltage, applying a burning voltage to the drain electrode of the transistor device, wherein the burning voltage is greater than the breakdown voltage.

* * * * *